US008920611B2

(12) United States Patent
Forster et al.

(10) Patent No.: US 8,920,611 B2
(45) Date of Patent: Dec. 30, 2014

(54) METHOD FOR CONTROLLING RADIAL DISTRIBUTION OF PLASMA ION DENSITY AND ION ENERGY AT A WORKPIECE SURFACE BY MULTI-FREQUENCY RF IMPEDANCE TUNING

(75) Inventors: John C. Forster, San Francisco, CA (US); Daniel J. Hoffman, Saratoga, CA (US); John A. Pipitone, Livermore, CA (US); Xianming Tang, San Jose, CA (US); Rongjun Wang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1518 days.

(21) Appl. No.: 12/173,228

(22) Filed: Jul. 15, 2008

(65) Prior Publication Data

US 2010/0012480 A1 Jan. 21, 2010

(51) Int. Cl.
*C23C 14/34* (2006.01)
*H01J 37/34* (2006.01)
*H01J 37/32* (2006.01)

(52) U.S. Cl.
CPC .......... *H01J 37/34* (2013.01); *H01J 37/32165* (2013.01); *H01J 37/3444* (2013.01)
USPC ............. 204/192.12; 204/298.08; 118/723 E; 156/345.43

(58) Field of Classification Search
CPC ...... C23C 14/345; C23C 14/54; C23C 14/542
USPC ........ 204/192.12, 192.1; 156/345.44, 345.43; 118/723 E
See application file for complete search history.

(56) References Cited

U.S. PATENT DOCUMENTS

| 4,824,546 | A | 4/1989 | Ohmi |
| 5,187,457 | A | 2/1993 | Chawla et al. |
| 5,660,694 | A | 8/1997 | Ohmi et al. |
| 6,706,138 | B2 * | 3/2004 | Barnes et al. ............... 156/345.1 |
| 7,084,369 | B2 | 8/2006 | Sosnowski |
| 7,780,814 | B2 | 8/2010 | Pipitone et al. |
| 2003/0019581 | A1 | 1/2003 | Drewery |
| 2004/0035365 | A1 | 2/2004 | Yamazawa et al. |
| 2006/0112878 | A1 * | 6/2006 | Ni et al. ..................... 118/723 E |
| 2008/0179011 | A1 * | 7/2008 | Collins et al. ............. 156/345.44 |

FOREIGN PATENT DOCUMENTS

JP 2006286303 A 10/2006

OTHER PUBLICATIONS

U.S. Appl. No. 12/173,198, filed Jul. 15, 2008, Forster et al.
Logan, J., "Control of RF Sputtered Film Properties through Substrate Tuning", IBM J. Res. Develop., 1970, pp. 172-175, vol. 14.

(Continued)

*Primary Examiner* — John Brayton
(74) *Attorney, Agent, or Firm* — Robert M. Wallace

(57) ABSTRACT

The method of performing physical vapor deposition on a workpiece includes performing at least one of the following: (a) increasing ion density over a workpiece center while decreasing ion density over a workpiece edge by decreasing impedance to ground at a target source power frequency $f_s$ through a bias multi-frequency impedance controller relative to the impedance to ground at the source power frequency $f_s$ through the side wall; or (b) decreasing ion density over the workpiece center while increasing ion density over the workpiece edge by increasing the impedance to ground at $f_s$ through the bias multi-frequency impedance controller relative to the impedance to ground at $f_s$ through the side wall.

15 Claims, 9 Drawing Sheets

(56) References Cited

OTHER PUBLICATIONS

Keller, Pennebaker, "Electrical Properties of RF Sputtering Systems", IBM J. Res. Develop., 1979, pp. 3-15, vol. 3.

Logan, J., "High Rate Radio frequency Sputtering using In-Phase Plasma Confinement", J. Vac. Sci. Technol., 1990, pp. 1835-1838, vol. A8.

Rauf, S., "Effect of Bias Voltage Waveform Ion Energy Distribution", J. Appl. Phys., 2000, pp. 7647-7651, vol. 87.

Berry, L., et al., "Control of the Radio-Frequency Wave Form at the Chuck of an Industrial Oxide-Etch Reactor", J. Vac. Sci. Technol., 2000, pp. 2806-2814, vol. A18.

Official Action dated Jan. 25, 2012 Issued in Co-Pending U.S. Appl. No. 12/173,198.

Official Action Dated Oct. 12, 2012 Issued in Co-Pending U.S. Appl. No. 12/173,198.

Official Action dated Sep. 27, 2013 issued in Co-pending U.S. Appl. No. 12/173,198.

Official Action dated May 6, 2014 issued in Co-pending U.S. Appl. No. 12/173,198.

\* cited by examiner

US 8,920,611 B2

METHOD FOR CONTROLLING RADIAL DISTRIBUTION OF PLASMA ION DENSITY AND ION ENERGY AT A WORKPIECE SURFACE BY MULTI-FREQUENCY RF IMPEDANCE TUNING

BACKGROUND

Plasma processing is employed in fabrication of integrated circuits, masks for use in photolithographic processing of integrated circuits, plasma displays and solar technology, for example. In the fabrication of integrated circuits, a semiconductor wafer is processed in a plasma chamber. The process may be a reactive ion etch (RIE) process, a plasma enhanced chemical vapor deposition (PECVD) process or a plasma enhanced physical vapor deposition (PEPVD) process, for example. Recent technological advances in integrated circuits have reduced feature sizes to less than 32 nanometers. Further reductions will require more precise control over process parameters at the wafer surface, including plasma ion energy spectrum, plasma ion energy radial distribution (uniformity), plasma ion density and plasma ion density radial distribution (uniformity). In addition, better consistency in such parameters between reactors of identical design is required. Ion density is important in PEPVD processes, for example, because ion density at the wafer surface determines deposition rate and the competing etch rate. At the target surface, target consumption (sputtering) rate is affected by ion density at the target surface and ion energy at the target surface.

Currently, uniformity of PEPVD deposition rate and deposited film properties cannot be precisely controlled, and is dependent upon chamber geometry, such as a large wafer-to-target distance. There is a need to precisely adjust or control uniformity of deposition rate, by controlling ion density distribution across the wafer surface. There is a need to precisely adjust or control uniformity of deposited film properties by controlling ion energy distribution across the wafer surface.

SUMMARY

A method is provided for performing physical vapor deposition in a plasma reactor chamber in which source power at a frequency $f_s$ is applied to a sputter target and bias power at a frequency $f_b$ is applied to a workpiece. For RF source power at $f_s$ from the target, a center RF ground return path is established through the workpiece via a bias multi-frequency impedance controller and an edge RF ground return path is established through a side wall of the chamber. For RF bias power at $f_b$ from the workpiece, a center RF ground return path is established through the target via a target multi-frequency impedance controller and an edge RF ground return path is established through the side wall. The method includes performing at least one of the following: (a) increasing ion density over a workpiece center while decreasing ion density over a workpiece edge by decreasing impedance to ground at $f_s$ through the bias multi-frequency impedance controller relative to the impedance to ground at the source power frequency $f_s$ through the side wall; or (b) decreasing ion density over the workpiece center while increasing ion density over the workpiece edge by increasing the impedance to ground at $f_s$ through the bias multi-frequency impedance controller relative to the impedance to ground at $f_s$ through the side wall.

In one embodiment, the method further includes increasing ion energy over the workpiece center while decreasing ion energy over the workpiece edge by decreasing impedance to ground at the bias power frequency $f_b$ through the target multi-frequency impedance controller relative to the impedance to ground at $f_b$ through the side wall.

In one embodiment, the method further includes decreasing ion energy over workpiece center while increasing ion energy over workpiece edge by increasing impedance to ground at $f_b$ through the target multi-frequency impedance controller relative to the impedance to ground at $f_b$ through the side wall.

In one embodiment, the method further includes suppressing at the workpiece surface a particular frequency component corresponding to a certain harmonic or intermodulation product of one or both of $f_s$ and $f_b$. In one implementation, the suppressing is carried out by increasing the impedance to ground at the particular frequency through the pedestal multi-frequency impedance controller.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
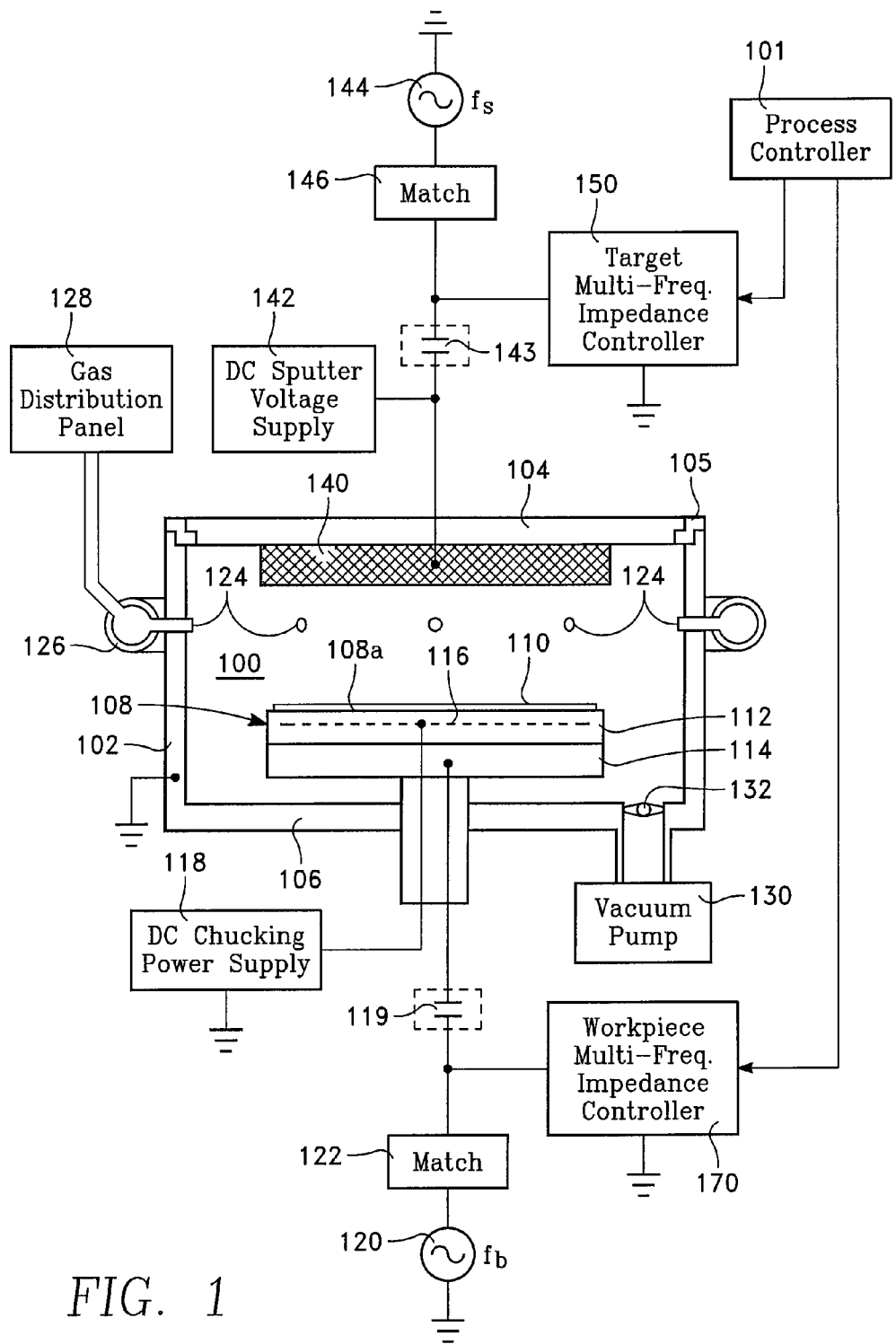
FIG. 1 depicts a plasma reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

In one embodiment, a first multi-frequency impedance controller is coupled between a sputter target of a PVD reactor and RF ground. Optionally, and in addition, a second multi-frequency impedance controller is coupled between the wafer susceptor or cathode and RF ground.

The first multi-frequency impedance controller (which is connected to the ceiling or sputter target) governs the ratio of the impedances to ground through the ceiling (sputter target) and the side wall. At low frequencies, this ratio affects the radial distribution of ion energy across the wafer. At very high frequencies, this ratio affects the radial distribution of ion density across the wafer.

The second multi-frequency impedance controller (which is connected to the cathode or wafer susceptor) governs the ratio of the impedances to ground through the cathode and the side wall. At low frequencies, this ratio affects the radial distribution of ion energy across the ceiling or sputter target. At very high frequencies, this ratio affects the radial distribution of ion density across ceiling or sputter target.

Each multi-frequency impedance controller governs the impedance to ground through the ceiling (in the case of the first controller) or through the cathode (in the case of the second controller) of different frequencies present in the plasma, including harmonics of the bias power frequency, harmonics of the source power frequency, intermodulation products of the source and bias power frequencies and their harmonics, for example. The harmonics and intermodulation products may be selectively suppressed from the plasma by the multi-frequency impedance controller, in order to minimize inconsistencies in performance between reactors of the same design. It is our belief that some of these harmonics and intermodulation products are responsible for inconsistencies in reactor performance between reactors of identical design.

For very high frequencies, the first multi-frequency impedance controller's impedance to ground through the ceiling or target (with reference to the impedance through the grounded side wall) controls the radial distribution of ion density across the wafer surface is changed for fine adjustment. For low frequencies, the first multi-frequency impedance controller's impedance to ground through the ceiling or target (with reference to the impedance through the grounded side wall) controls the radial distribution of ion energy across the wafer surface is changed for fine adjustment.

For very high frequencies, the second multi-frequency impedance controller's impedance to ground through the wafer or cathode (with reference to the impedance through the grounded side wall) controls the radial distribution of ion density across the ceiling or sputter target. For low frequencies, the second multi-frequency impedance controller's impedance to ground through the wafer or cathode (with reference to the impedance through the grounded side wall) controls the radial distribution of ion energy across the sputter target or ceiling. The foregoing features provide a novel process control mechanism to regulate the reactor performance and uniformity.

In addition to governing distribution of ion energy and/or ion density across the wafer surface and across the ceiling (target) surface, the multi-frequency impedance controllers also govern the composite (total) ion density and ion energy at these surfaces through governance of impedance to ground at appropriate frequencies (e.g., low frequencies for ion energy and very high frequencies for ion density). Therefore, the controllers determine process rates at the wafer and target surfaces. Selected harmonics are tuned, depending upon the desired effect, either to promote their presence in the plasma or to suppress them. The tuning of the harmonics affects ion energies at wafer, thereby affecting process uniformity. In a PVD reactor, tuning of the ion energy affects step coverage, overhang geometry and physical film properties such as grain size, crystal orientation, film density, roughness and film composition. Each multiple frequency impedance controller can further be employed to enable or prevent deposition, etching or sputtering of the target or wafer or both, by appropriate adjustment of impedance to ground for selected frequencies, as will be described in detail in this specification. For example, in one mode, the target is sputtered while deposition is carried out on the wafer. In another mode, the wafer is etched while sputtering of the target is prevented, for example.

FIG. 1 depicts a PEPVD plasma reactor in accordance with a first embodiment. The reactor includes a vacuum chamber 100 enclosed by a cylindrical side wall 102, a ceiling 104 and a floor 106. A workpiece support pedestal 108 within the chamber 100 has a support surface 108a for supporting a workpiece such as a semiconductor wafer 110. The support pedestal 108 may consist of an insulating (e.g., ceramic) top layer 112 and a conductive base 114 supporting the insulating top layer 112. A planar conductive grid 116 may be encapsulated within the top insulating layer 112 to serve as an electrostatic clamping (ESC) electrode. A D.C. clamping voltage source 118 is connected to the ESC electrode 116. An RF plasma bias power generator 120 of a bias frequency $f_b$ may be coupled through an impedance match 122 to either the ESC electrode 116 or to the conductive base 114. The conductive base 114 may house certain utilities such as internal coolant channels (not shown), for example. If the bias impedance match 122 and bias generator 120 are connected to the ESC electrode 116 instead of the conductive base 114, then an optional capacitor 119 may be provided to isolate the impedance match 122 and RF bias generator 120 from the D.C. chucking power supply 118.

Process gas is introduced into the chamber 100 by suitable gas dispersing apparatus. For example, in the embodiment of FIG. 1, the gas dispersing apparatus consists of gas injectors 124 in the side wall 102, the gas injectors being supplied by a ring manifold 126 coupled to a gas distribution panel 128 that includes various supplies of different process gases (not shown). The gas distribution panel 128 controls the mixture of process gases supplied to the manifold 126 and the gas flow rate into the chamber 100. Gas pressure in the chamber 100 is controlled by a vacuum pump 130 coupled to the chamber 100 through a pumping port 132 in the floor 106.

A PVD sputter target 140 is supported on the interior surface of the ceiling 104. A dielectric ring 105 insulates the ceiling 104 from the grounded side wall 102. The sputter target 140 is typically a material, such as a metal, to be deposited on the surface of the wafer 110. A high voltage D.C. power source 142 may be coupled to the target 140 to promote plasma sputtering. RF plasma source power may be applied to the target 140 from an RF plasma source power generator 144 of frequency $f_s$ through an impedance match 146. A capacitor 143 isolates the RF impedance match 146 from the D.C. power source 142. The target 140 functions as an electrode that capacitively couples RF source power to plasma in the chamber 100.

A first (or "target") multi-frequency impedance controller 150 is connected between the target 140 and RF ground. Optionally, a second (or "bias") multi-frequency impedance controller 170 is connected between the output of the bias match 122 (i.e., to either the conductive base 114 or to the grid electrode 116, depending upon which one is driven by the bias generator 120). A process controller 101 controls the two impedance controllers 150, 170. The process controller can respond to user instructions to increase or decrease the impedance to ground of a selected frequency through either of the first and second multi-frequency impedance controllers 150, 170.

Figure 2:
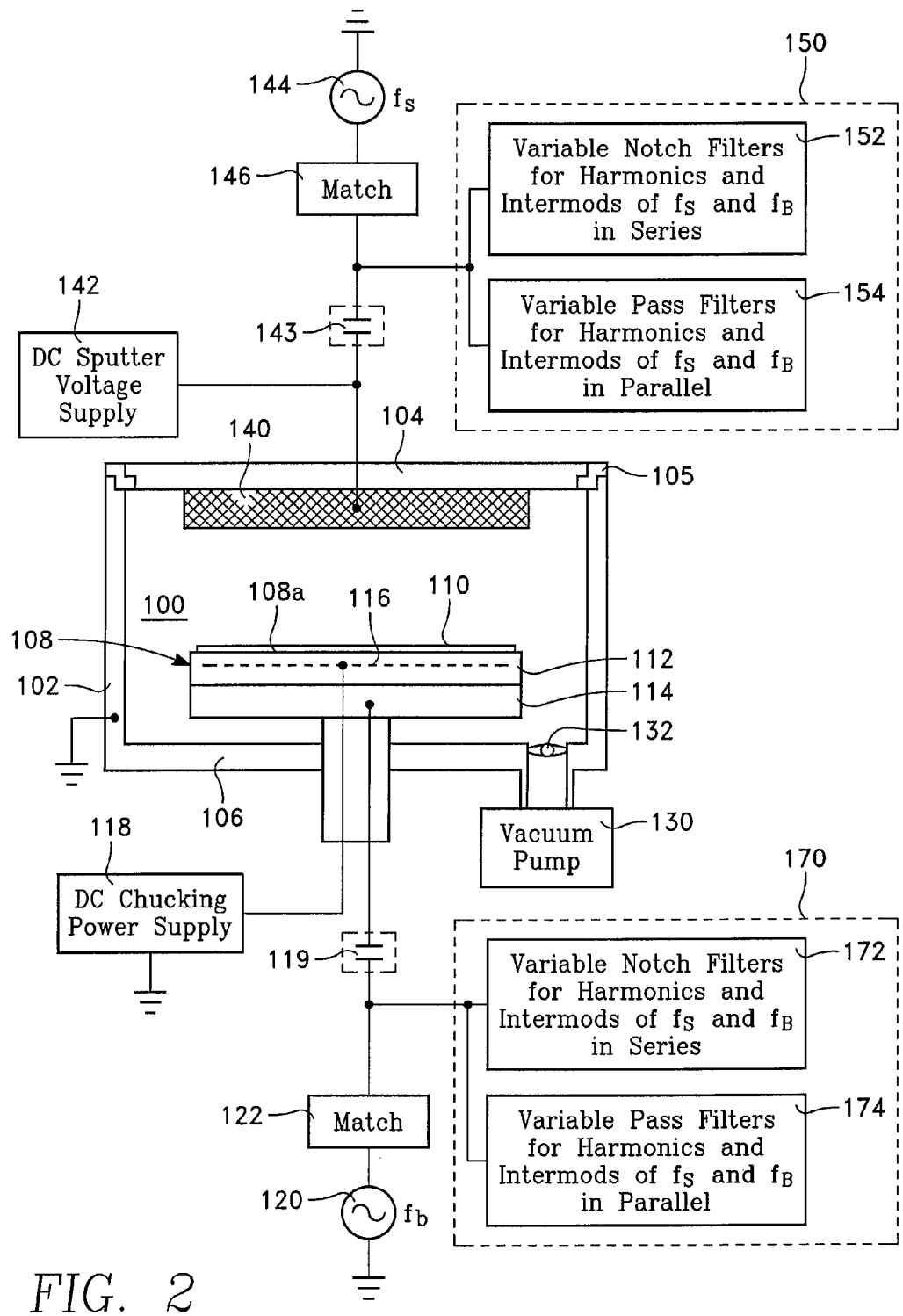
FIG. 2 depicts the structure of multi-frequency impedance controllers in the reactor of FIG. 1.

Referring to FIG. 2, the first multi-frequency impedance controller 150 includes an array 152 of variable band reject ("notch") filters and an array 154 of variable band pass ("pass") filters. The notch filter array 152 consists of many notch filters, each notch filter blocking a narrow frequency band, one notch filter being provided for each frequency of interest. The impedance presented by each notch filter may be variable, to provide full control of impedances for each frequency of interest. The frequencies of interest include the bias frequency $f_b$, the source frequency $f_s$, harmonics of $f_s$, harmonics of $f_b$, intermodulation products of $f_s$ and $f_b$ and the harmonics of the intermodulation products. The pass filter array 154 consists of many pass filters, each pass filter passing (presenting a low impedance to) a narrow frequency band, one pass filter being provided for each frequency of interest. The impedance presented by each notch filter may be variable, to provide full control of impedances for each frequency of interest. The frequencies of interest include the bias frequency $f_b$, the source frequency $f_s$, harmonics of $f_s$, harmonics of $f_b$, intermodulation products of $f_s$ and $f_b$ and harmonics of the intermodulation products.

Referring still to FIG. 2, the second multi-frequency impedance controller 170 includes an array 172 of variable band reject ("notch") filters and an array 174 of variable band pass ("pass") filters. The notch filter array 172 consists of many notch filters, each notch filter blocking a narrow frequency band, one notch filter being provided for each frequency of interest. The impedance presented by each notch filter may be variable, to provide full control of impedances for each frequency of interest. The frequencies of interest include the bias frequency $f_b$, the source frequency $f_s$, harmonics of $f_s$ and $f_b$ and intermodulation products of $f_s$ and $f_b$. The pass filter array 174 consists of many pass filters, each pass filter passing (presenting a low impedance to) a narrow frequency band, one pass filter being provided for each frequency of interest. The impedance presented by each notch filter may be variable, to provide full control of impedances for each frequency of interest. The frequencies of interest include the bias frequency $f_b$, the source frequency $f_s$, harmonics of $f_s$ and $f_b$ and intermodulation products of $f_s$ and $f_b$.

Figure 3:
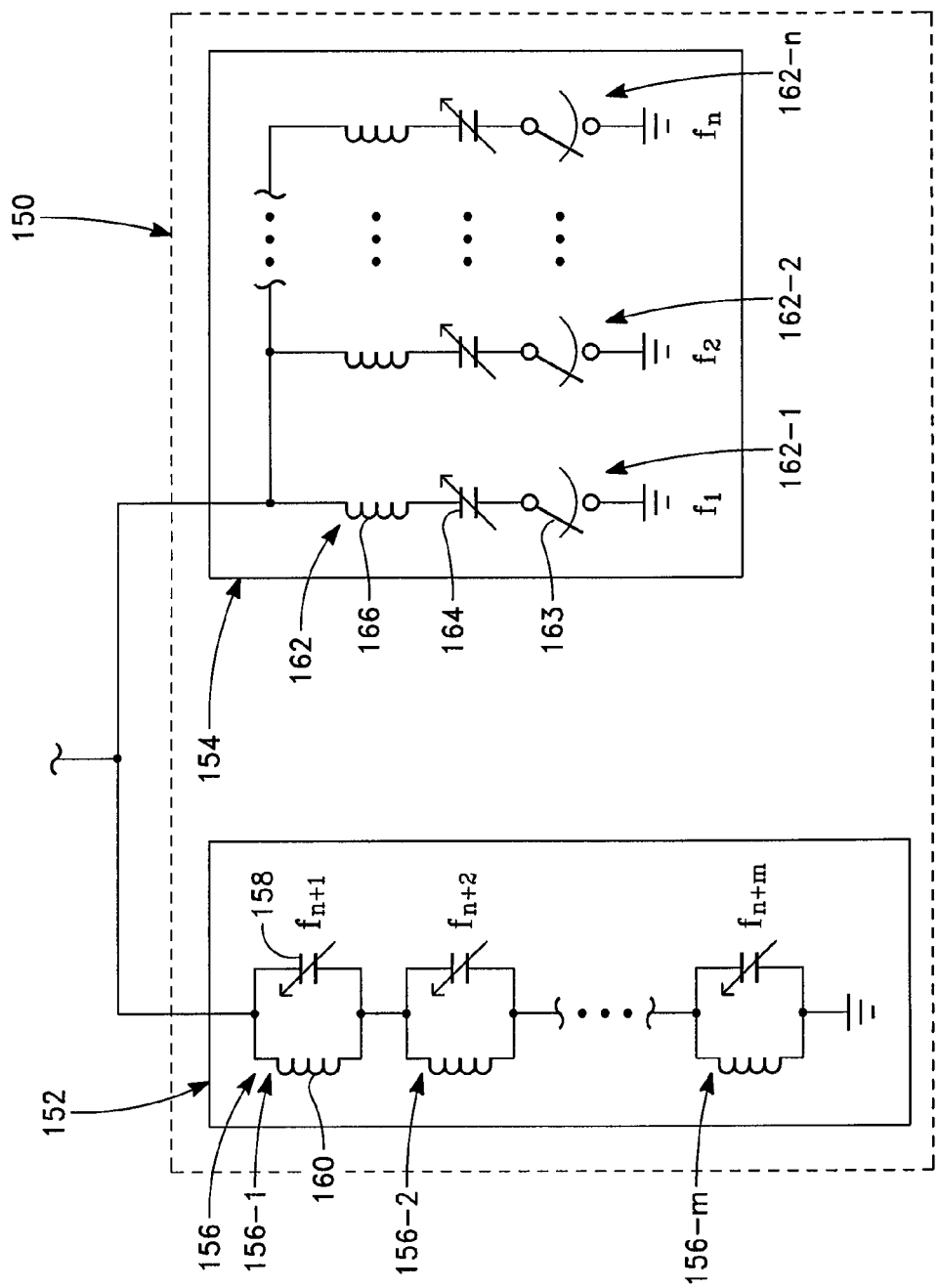
FIG. 3 depicts a circuit implementation of a target multi-frequency impedance controller of FIG. 2.

FIG. 3 depicts the target multi-frequency controller with one implementation of the notch filter array 152 and the pass filter array 154. The notch filter array 152 includes a set of m (where m is an integer) individual notch filters 156-1 through 156-m connected in series. Each individual notch filter 156 consists of a variable capacitor 158 of capacitance C and an inductor 160 of inductance L, the individual notch filter having a resonant frequency $f_r = 1/[2\pi(LC)^{1/2}]$. The reactances L and C of each notch filter 156 are different and are selected so that the resonant frequency $f_r$ of a particular notch filter corresponds to one of the frequencies of interest, each notch filter 156 having a different resonant frequency. The resonant frequency of each notch filter 156 is the center of the narrow band of frequencies blocked by the notch filter 156.

The pass filter array 154 of FIG. 3 includes a set of n (where n is an integer) individual pass filters 162-1 through 162-n connected in parallel. Each individual pass filter 162 consists of a variable capacitor 164 of capacitance C and an inductor 166 of inductance L, the pass filter 162 having a resonant frequency $f_r = 1/[2\pi(LC)^{1/2}]$. Optionally, each pass filter 162 may include, in addition, a series switch 163 to permit the pass filter to be disabled whenever desired. The reactances L and C of each pass filter 162 are different and are selected so that the resonant frequency $f_r$ corresponds to one of the frequencies of interest, each pass filter 162 having a different resonant frequency. The resonant frequency of each pass filter 162 is the center of the narrow band of frequencies passed or admitted by the pass filter 162. In the implementation of FIG. 3, there are n pass filters 162 in the pass filter array 154 and m notch filters in the notch filter array 152.

Figure 4:
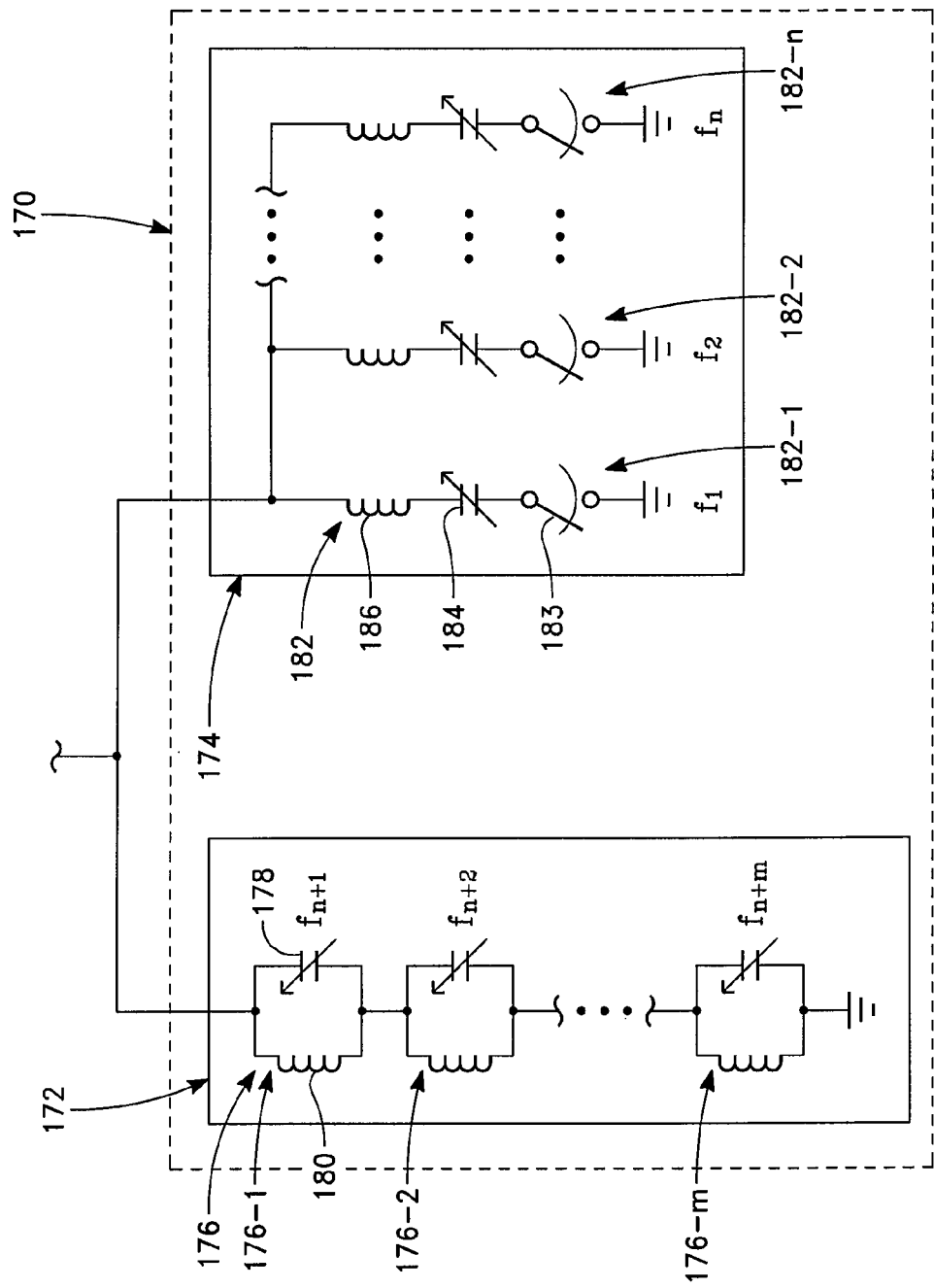
FIG. 4 depicts a circuit implementation of a pedestal multi-frequency impedance controller of FIG. 2.

The notch filter array 172 and pass filter array 174 for the second multi-frequency impedance controller 170 may be implemented in a similar manner, as depicted in FIG. 4. The notch filter array 172 includes a set of m (where m is an integer) individual notch filters 176-1 through 176-m connected in series. Each individual notch filter 176 consists of a variable capacitor 178 of capacitance C and an inductor 180 of inductance L, the individual notch filter having a resonant frequency $f_r = 1/[2\pi(LC)^{1/2}]$. The reactances L and C of each notch filter 176 are different and are selected so that the resonant frequency $f_r$ of a particular notch filter corresponds to one of the frequencies of interest, each notch filter 176 having a different resonant frequency. The resonant frequency of each notch filter 176 is the center of the narrow band of frequencies blocked by the notch filter 176.

The pass filter array 174 of FIG. 4 includes a set of n (where n is an integer) individual pass filters 182-1 through 182-n connected in parallel. Each individual pass filter 182 consists of a variable capacitor 184 of capacitance C and an inductor 186 of inductance L, the pass filter 182 having a resonant frequency $f_r \mu = 1/[2\pi(LC)^{1/2}]$. Optionally, each pass filter 182 may include, in addition, a series switch 183 to permit the pass filter to be disabled whenever desired. The reactances L and C of each pass filter 182 are different and are selected so that the resonant frequency $f_r$ corresponds to one of the frequencies of interest, each pass filter 182 having a different resonant frequency. The resonant frequency of each pass filter 182 is the center of the narrow band of frequencies passed or admitted by the pass filter 182. In the implementation of FIG. 4, there are n pass filters 182 in the pass filter array 174 and m notch filters 176 in the notch filter array 172.

Precise control of RF ground return paths through each of the multi-frequency impedance controllers at selected frequencies is attained by the process controller 101 individually governing each of the variable capacitors 158, 164 of the first multi-frequency impedance controller 150 and each of the variable capacitors 178, 184 of the second multi-frequency impedance controller 170.

Figure 5:
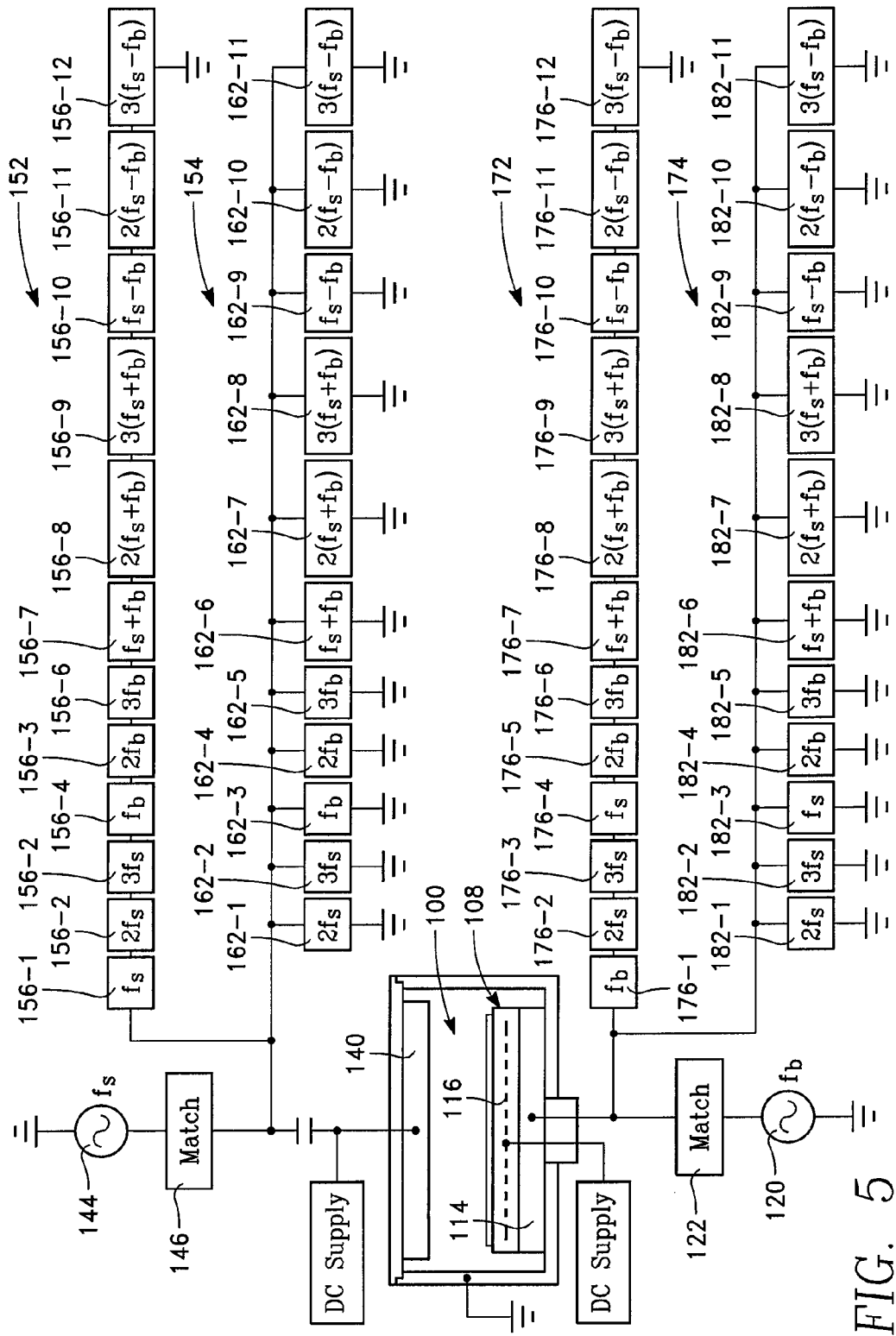
FIG. 5 depicts one embodiment if the target and pedestal multi-frequency impedance controllers.

Referring now to FIG. 5, the resonant frequencies of the n pass filters 162-1 through 162-11 in the pass filter array 154 of the first (target) multi-frequency impedance controller 150 are harmonics and intermodulation products of the source and bias power frequencies $f_s$ and $f_b$ may include the following frequencies: $2f_s$, $3f_s$, $f_b$, $2f_b$, $3f_b$, $f_s+f_b$, $2(f_s+f_b)$, $3(f_s+f_b)$, $f_s-f_b$, $2(f_s-f_b)$, $3(f_s-f_b)$. In this example, n=11. The resonant frequencies of the m notch filters 156-1 through 156-12 in the notch filter array 152 of the first multi-frequency impedance controller are also harmonics and intermodulation products of the source and bias power frequencies $f_s$ and $f_b$ may include the following frequencies: $f_s$, $2f_s$, $3f_s$, $f_b$, $2f_b$, $3f_b$, $f_s+f_b$, $2(f_s+f_b)$, $3(f_s+f_b)$, $f_s-f_b$, $2(f_s-f_b)$, $3(f_s-f_b)$. In this example, m=12. The notch filter 156-1 having the resonant frequency $f_s$ blocks the fundamental frequency of the source power generator 144 to prevent it from being shorted through the impedance controller 150.

Referring still to FIG. 5, the resonant frequencies of the n pass filters 182-1 through 182-11 in the pass filter array 174 of the second (bias) multi-frequency impedance controller 170 are harmonics and intermodulation products of the source and bias power frequencies $f_s$ and $f_b$ may include the following frequencies: $2f_s$, $3f_s$, $f_s$, $2f_b$, $3f_b$, $f_s+f_b$, $2(f_s+f_b)$, $3(f_s+f_b)$, $f_s-f_b$, $2(f_s-f_b)$, $3(f_s-f_b)$, in which case n=11. The resonant frequencies of the m notch filters 176-1 through 176-12 in the notch filter array 172 of the second (bias) multi-frequency impedance controller 170 are also harmonics and intermodulation products of the source and bias power frequencies $f_s$ and $f_b$ may include the following frequencies: $f_b$, $2f_s$, $3f_s$, $f_s$, $2f_b$, $3f_b$, $f_s+f_b$, $2(f_s+f_b)$, $3(f_s+f_b)$, $f_s-f_b$, $2(f_s-f_b)$, $3(f_s-f_b)$. In this example, m=12. The notch filter 176-1 having the resonant frequency $f_b$ blocks the fundamental frequency of the bias power generator 120 to prevent it from being shorted through the impedance controller 170.

As described above, each pass filter (162, 182) may include an optional switch (163, 183, respectively) to disable the pass filter in the event that its resonant frequency is to be blocked by a notch filter. For example, each pass filter 162 of FIG. 3 can include a series switch 163, and each pass filter 182 of FIG. 4 can include a series switch 183. However, if the multi-frequency impedance controllers 150, 170 are implemented with prior knowledge of which frequencies are to be blocked and which ones are to be admitted through the respective controllers, then, within a particular controller, a notch filter would be provided for each frequency to be blocked by that controller, and no pass filter would be provided in that controller for the blocked frequencies. In such an implementation, the notch filters would be tuned only to the frequencies to be blocked while the pass filters would be tuned only to the frequencies to be admitted within an individual controller, the two sets of frequencies being mutually exclusive in one embodiment. This implementation would avoid the need for the pass filter series switches 163, 183.

Figure 6:
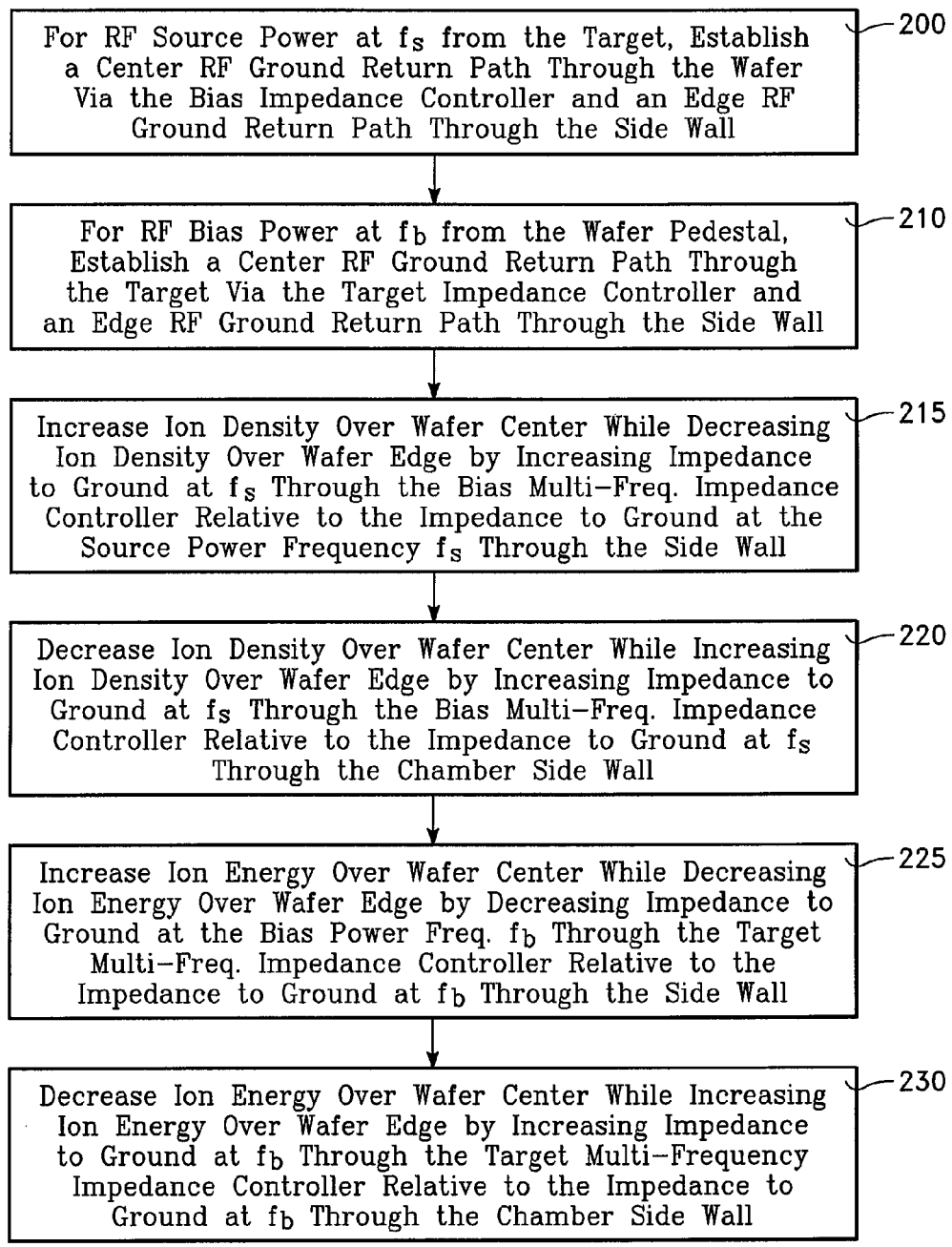
FIG. 6 is a block diagram depicting a first method in accordance with one embodiment.
Figure 7:
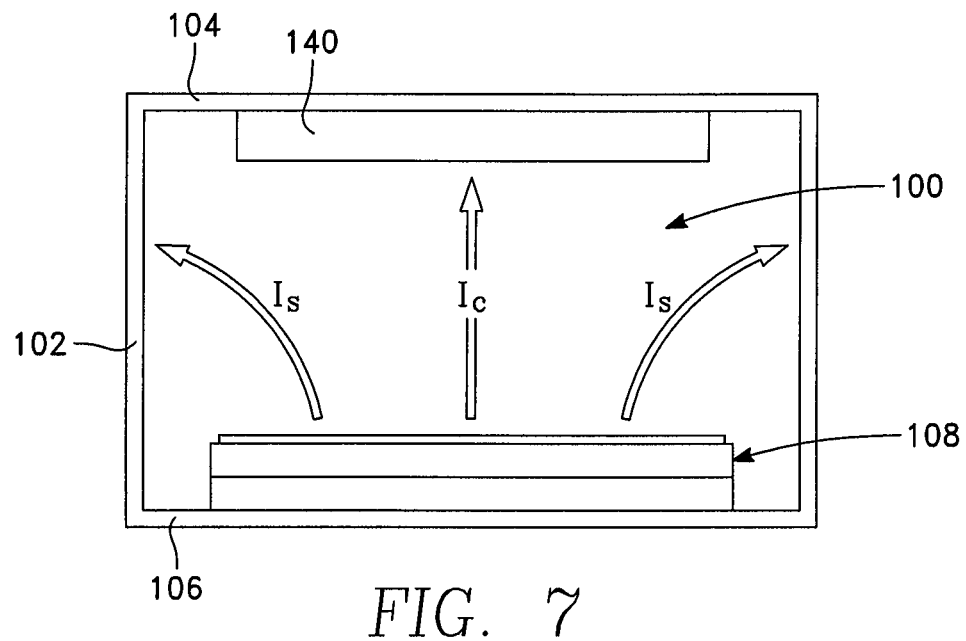
FIG. 7 depicts the different ground return paths for RF bias power controlled by a target multi-frequency impedance controller in the reactor of FIG. 1.
Figure 8:
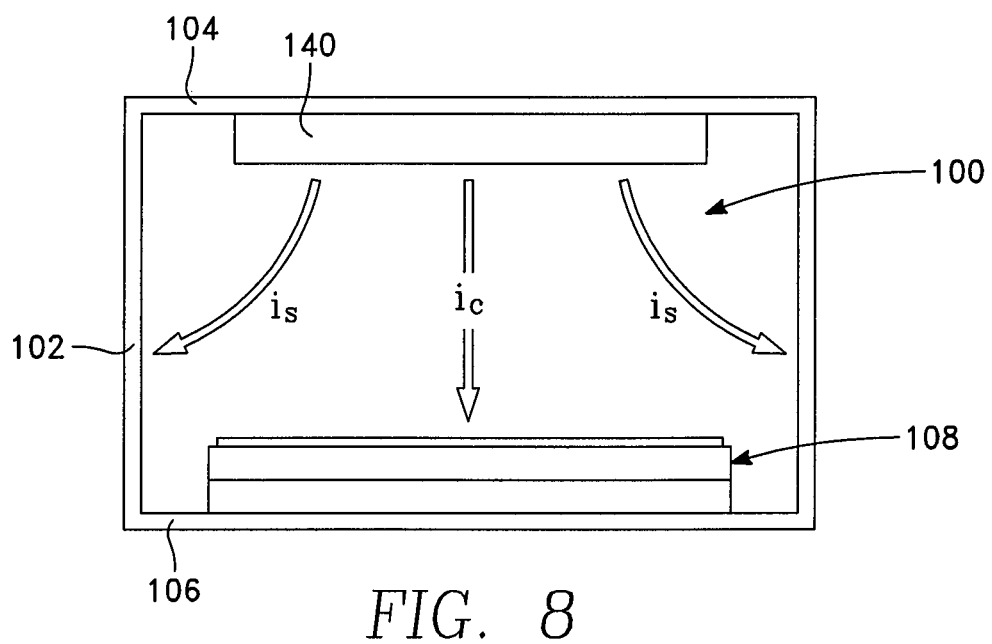
FIG. 8 depicts the different ground return paths for RF source power controlled by a cathode multi-frequency impedance controller in the reactor of FIG. 1.

FIG. 6 depicts a method of operating the reactor of FIGS. 1 through 3. In the method, the bias power current from the wafer is apportioned, as depicted in FIG. 7, between a center path to the target, $I_c$, and an edge path $I_s$, to the side wall. Also, source power current from the target is apportioned, as depicted in FIG. 8, between a center path to the wafer, $i_c$, and an edge path $i_s$, to the side wall. Thus, for RF source power at the source power frequency $f_s$ from the target, the method includes establishing a center RF ground return path through the wafer via the bias impedance controller 170 and an edge RF ground return path through the side wall (block 200 of FIG. 6). For RF bias power at $f_b$ from the wafer pedestal, the method includes establishing a center RF ground return path through the target via the target impedance controller 150 and an edge RF ground return path through the side wall (block 210 of FIG. 6).

Figure 9:
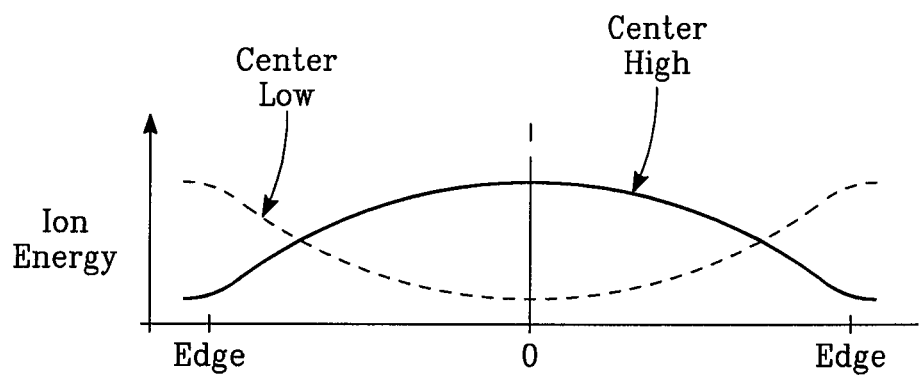
FIG. 9 is a graph depicting different radial distributions of ion energy across a wafer or target surface that can be produced by adjusting a multi-frequency impedance controller in the reactor of FIG. 1.

In one aspect of the method, ion density over wafer center is increased while decreasing ion density over wafer edge, by decreasing impedance to ground at $f_s$ through the bias multi-frequency impedance controller 170 relative to the impedance to ground at the source power frequency $f_s$ through the side wall (block 215 of FIG. 6). This increases the tendency toward a center high ion density distribution depicted in solid line in FIG. 9. This step may be carried out by adjusting the resonant frequency of the pass filter 182-3 closer to the source frequency $f_s$.

In another aspect, ion density is decreased over wafer center while increasing ion density over wafer edge by increasing impedance to ground at $f_s$ through the bias multi-frequency impedance controller 170 relative to the impedance to ground at $f_s$ through the side wall (block 220 of FIG. 6). This increases the tendency toward a center low edge high ion density distribution depicted in dashed line in FIG. 9. This step may be carried out by adjusting the resonant frequency of the pass filter 182-3 further (away) from the source frequency $f_s$.

Figure 10:
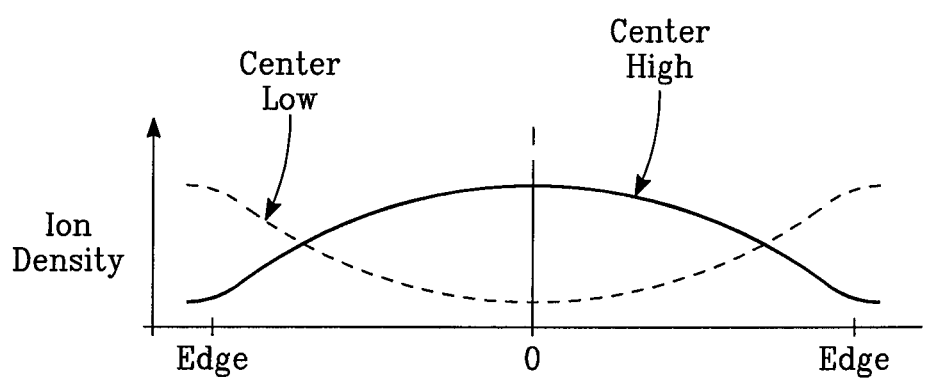
FIG. 10 is a graph depicting different radial distributions of ion density across a wafer or target surface that can be produced by adjusting a multi-frequency impedance controller in the reactor of FIG. 1.

In a further aspect, ion energy over wafer center is increased while decreasing ion energy over wafer edge by decreasing impedance to ground at the bias power frequency $f_b$ through the target multi-frequency impedance controller 150 relative to the impedance to ground at $f_b$ through the side wall (block 225 of FIG. 6). This increases the tendency toward a center high ion energy distribution depicted in solid line in FIG. 10. This step may be carried out by adjusting the resonant frequency of the pass filter 162-3 closer to the bias frequency $f_b$.

In a yet further aspect, ion energy over wafer center is decreased while increasing ion energy over wafer edge by increasing impedance to ground at $f_b$ through the target multi-frequency impedance controller 150 relative to the impedance to ground at $f_b$ through the side wall (block 230 of FIG. 6). This increases the tendency toward a center low edge high ion energy distribution depicted in dashed line in FIG. 10. This step may be carried out by adjusting the resonant frequency of the pass filter 162-3 further away from the bias frequency $f_b$.

Figure 11:
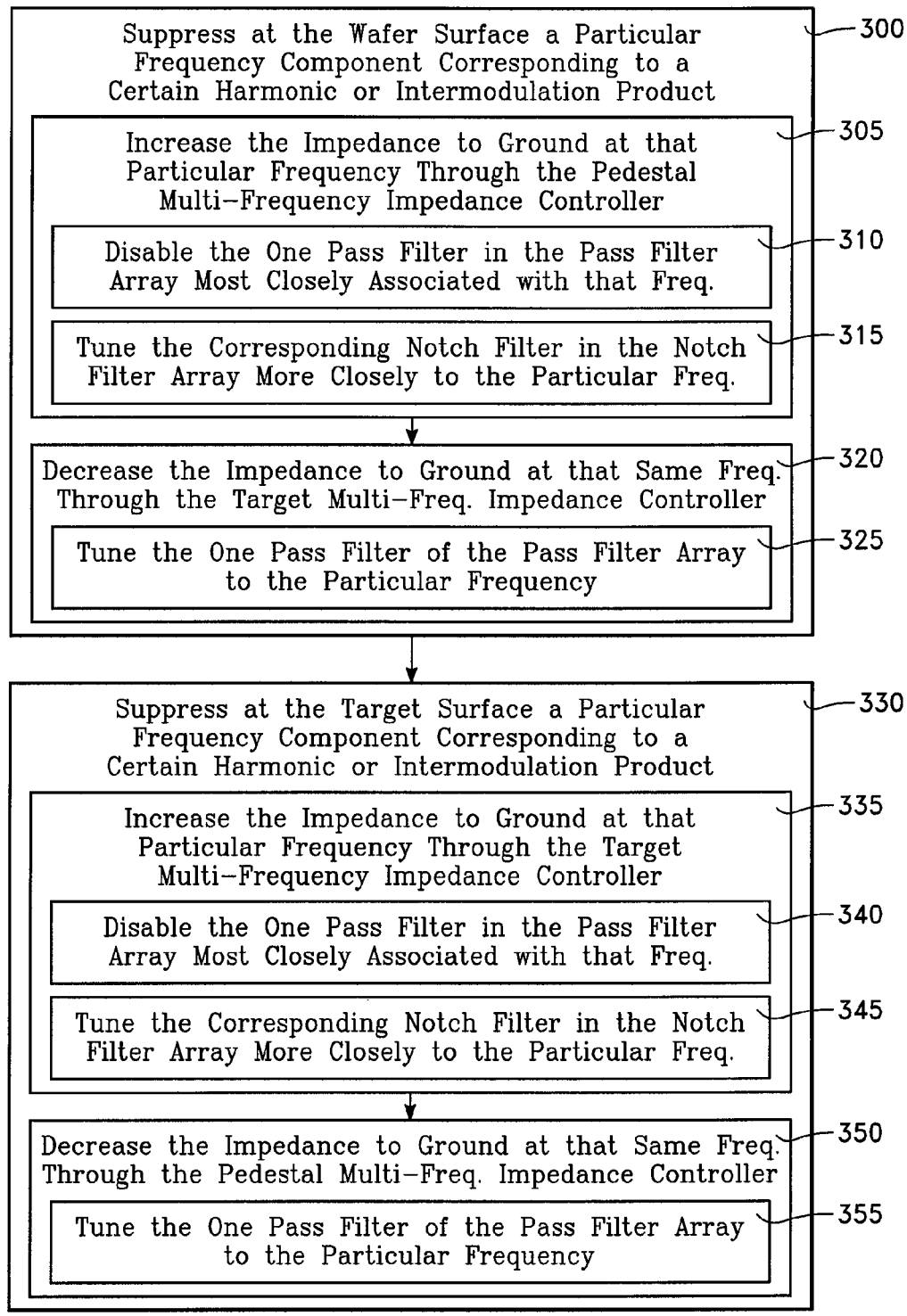
FIG. 11 is a block diagram depicting another method in accordance with one embodiment.

FIG. 11 illustrates a method for suppressing harmonics and/or intermodulation products or their harmonics at a chosen one of either the wafer surface or the target surface. Different frequencies may be suppressed at the different surfaces. This may be carried out, in one application, to optimize chamber matching among reactors of identical design, for example. In order to suppress at the wafer surface a particular frequency component corresponding to a certain harmonic or intermodulation product (block 300 of FIG. 11), plasma current components at that frequency are diverted to a surface other than the wafer surface, such as the side wall or the ceiling or target. In order to divert the undesired frequency component from the wafer to the ceiling, the impedance to ground at that particular frequency through the pedestal multi-frequency impedance controller 170 is increased (block 305 of FIG. 11). This may be accomplished by de-tuning or disabling the one pass filter in the pass filter array 174 most closely associated with that frequency (block 310), if there is one. In addition, the corresponding notch filter in the notch filter array 172 may be tuned more closely to the particular frequency (block 315). Optionally, or in addition, the undesired frequency component is drawn away from the wafer surface by diverting it to the target 140. This may be accomplished by decreasing the impedance to ground at the particular frequency through the target multi-frequency impedance controller 150, to divert the undesired components to ground through the target 140 and away from the wafer (block 320). This latter step may be accomplished by tuning one of the pass filters 156 having a corresponding resonant frequency closer to the frequency of the undesired component (block 325).

In order to suppress at the target surface a particular frequency component corresponding to a certain harmonic or intermodulation product (block 330), the impedance to ground at that particular frequency through the target multi-frequency impedance controller 150 is increased (block 335). This may be accomplished by de-tuning (or disconnecting) the one pass filter in the pass filter array 154 most closely associated with that frequency (block 340). In addition the corresponding notch filter in the notch filter array 152 may be tuned more closely to the particular frequency (block 345). Optionally, and in addition, the impedance to ground at that same frequency through the pedestal multi-frequency impedance controller 170 is decreased, to divert those components to ground away from the target (block 350). This latter step may be accomplished by tuning the one pass filter of the pass filter array 174 to the particular frequency (block 355).

Some of the foregoing steps may be employed to promote a desired frequency component at either the wafer surface or at the target surface. The plasma current frequency component may be chosen to be one which promotes or increases a particular action of the plasma, such as sputtering or deposition or etching. For example, a chosen plasma current frequency component may be directed or diverted to the target for such a purpose. This direction or diversion may be accomplished by performing the step of block 325, in which a chosen plasma current frequency component is diverted to the target 140. The diversion may be more complete by additionally performing the step of block 315 to repulse the chosen frequency component from the wafer surface.

Another chosen plasma current frequency component may be diverted to the wafer surface for a similar or other purpose (increase etch rate, deposition rate or sputter rate at the wafer surface, for example). This diversion may be accomplished by performing the step of block 355, in which a chosen plasma current frequency component is diverted to the wafer surface. This diversion may more complete by additionally performing the step of block 345 to repulse the chosen frequency component from the target surface. As one example, the chosen frequency component may be a frequency (a fundamental or harmonic or intermodulation product) that promotes a particular plasma action, such as sputtering. If it is desired to sputter the wafer without sputtering the target, then that frequency component is diverted away from the target and to the wafer by raising the impedance at that frequency through the target impedance controller 150 while reducing the impedance at the same frequency through the bias impedance controller 170. Conversely, if it is desired to sputter the target without sputtering the wafer, then that frequency component is diverted away from the wafer and to the target by decreasing the impedance at that frequency through the target impedance controller 150 while increasing the impedance at the same frequency through the bias impedance controller 170. The desired plasma effect may be obtained with a particular set of plural frequency components. In such a case, the plural frequency components are controlled in the foregoing manner using plural notch and/or pass filters operated simultaneously in accordance with the foregoing.

The foregoing features may be implemented in a plasma reactor lacking a sputter target, e.g., a plasma reactor adapted for processes other than physical vapor deposition. In such a reactor, for example, the target 140 and DC source 142 of FIG. 1 are absent, and the RF source power generator 144 and match 146 may be coupled to the ceiling 104. The ceiling 104 in such a case functions as a plasma source power applicator in the form of an electrode for capacitively coupling plasma source power into the chamber 100. In an alternative embodiment, the source power generator 144 and match 146 may be coupled to another RF source power applicator at the ceiling, such as a coil antenna for example.

While the foregoing is directed to embodiments of the present invention, other and further embodiments of the invention may be devised without departing from the basic scope thereof, and the scope thereof is determined by the claims that follow.

What is claimed is:

1. A method of performing physical vapor deposition in a plasma reactor chamber in which source power at a frequency $f_s$ is applied through a first impedance match to a sputter target, and bias power at a frequency $f_b$ is applied through a second impedance match to a workpiece electrode underlying a workpiece, said method comprising:

grounding said side wall and connecting a first multi-frequency impedance controller between ground and an element comprising one of said workpiece electrode and said sputter target;

adjusting distribution of ion density across said element by adjusting impedance to ground at $f_s$ through said first multi-frequency impedance controller relative to the impedance to ground at the source power frequency $f_s$ through the side wall;

suppressing at said element respective frequencies comprising at least an intermodulation product of $f_s$ and $f_b$, by controlling in said first multi-frequency impedance controller respective filters corresponding to said respective frequencies;

wherein said suppressing comprises providing in said first multi-frequency impedance controller respective filters connected to ground and tuned to respective frequencies corresponding to harmonics of $f_s$, harmonics of $f_b$ and intermodulation products of $f_s$ and $f_b$, and controlling said respective filters to suppress plural ones of said respective frequencies.

2. The method of claim 1 wherein said first multi-frequency impedance controller comprises a bias multi-frequency impedance controller connected to said workpiece electrode, said method further comprising:

connecting a target multi-frequency impedance controller between said sputter target and ground;

adjusting distribution of ion energy over the workpiece by adjusting impedance to ground at the bias power frequency $f_b$ through the target multi-frequency impedance controller relative to the impedance to ground at $f_b$ through the side wall.

3. The method of claim 1 wherein said suppressing comprises:

increasing the impedance to ground at a particular frequency through said first multi-frequency impedance controller.

4. The method of claim 3 wherein said increasing the impedance comprises tuning a corresponding notch filter in said first multi-frequency impedance controller toward said particular frequency.

5. The method of claim 3 wherein said suppressing further comprises:

decreasing the impedance to ground at said particular frequency through a target multi-frequency impedance controller connected between to said sputter target and ground.

6. The method of claim 1 further comprising:

suppressing at the target a particular frequency component corresponding to an intermodulation product of $f_s$ and $f_b$.

7. The method of claim 6 wherein said first multi-frequency impedance controller comprises a bias multi-frequency impedance controller connected to said workpiece electrode, and wherein said suppressing at the target comprises:

connecting a target multi-frequency impedance controller between said sputter target and ground;

increasing the impedance to ground at said particular frequency through the target multi-frequency impedance controller.

8. The method of claim 7 wherein said suppressing at the target further comprises:

decreasing the impedance to ground at said particular frequency through the bias multi-frequency impedance controller.

9. A method of performing physical vapor deposition in a plasma reactor chamber in which source power at a frequency $f_s$ is applied through a first impedance match to a sputter target, and bias power at a frequency $f_b$ is applied through a second impedance match to a workpiece electrode underlying a workpiece, said method comprising:

grounding said side wall and connecting a bias multi-frequency impedance controller between said workpiece electrode and ground;

connecting a target multi-frequency impedance controller between said sputter target and ground;

adjusting distribution of ion energy over the workpiece by adjusting impedance to ground at the bias power frequency $f_b$ through the target multi-frequency impedance controller relative to the impedance to ground at $f_b$ through the side wall;

suppressing at the workpiece respective frequency components comprising at least an intermodulation product of $f_s$ and $f_b$, by controlling respective filters in said bias multi-frequency impedance controller corresponding to said respective frequency components; and wherein said suppressing comprises providing in said bias multi-frequency impedance controller said respective filters connected to ground and tuned to respective frequencies corresponding to harmonics of $f_s$, harmonics of $f_b$ and intermodulation products of $f_s$ and $f_b$, and controlling said respective filters to suppress plural ones of said respective frequencies.

10. The method of claim 9 wherein said suppressing comprises:

increasing the impedance to ground at a particular frequency through the bias multi-frequency impedance controller.

11. The method of claim 10 wherein said increasing the impedance comprises tuning a corresponding notch filter in the bias multi-frequency impedance controller toward said particular frequency.

12. The method of claim 10 wherein said suppressing further comprises:

decreasing the impedance to ground at said particular frequency through the target multi-frequency impedance controller.

13. The method of claim 9 further comprising:

suppressing at the target a particular frequency component corresponding to an intermodulation product of $f_s$ and $f_b$.

14. The method of claim 13 wherein said suppressing at the target comprises:

increasing the impedance to ground at said particular frequency through the target multi-frequency impedance controller.

15. The method of claim 14 wherein said suppressing at the target further comprises:

decreasing the impedance to ground at said particular frequency through the bias multi-frequency impedance controller.

* * * * *